(12) United States Patent
Nicoletta et al.

(10) Patent No.: US 7,281,946 B2
(45) Date of Patent: Oct. 16, 2007

(54) HERMETICALLY SEALED CERAMIC PACKAGE

(75) Inventors: Dino Nicoletta, Brooklyn, NY (US); Robert J. Satriano, Hackettstown, NJ (US)

(73) Assignee: American Berylia Corp., Haskell, NJ (US)

( * ) Notice: Subject to any disclaimer, the term of this patent is extended or adjusted under 35 U.S.C. 154(b) by 8 days.

(21) Appl. No.: 11/354,434

(22) Filed: Feb. 15, 2006

(65) Prior Publication Data

US 2007/0190851 A1    Aug. 16, 2007

(51) Int. Cl.
    *H01R 13/52* (2006.01)
(52) U.S. Cl. ...................................................... 439/521
(58) Field of Classification Search ................ 439/521, 439/279, 519, 403, 806–807, 793; 174/74 R, 174/77 R, 75 D
    See application file for complete search history.

(56) References Cited

U.S. PATENT DOCUMENTS 6,676,454 B2 *   1/2004   De France ................. 439/806
6,811,428 B1 *  11/2004   Sawyer et al. ............. 439/403
6,854,996 B2 *   2/2005   Yaworski et al. .......... 439/276

* cited by examiner

*Primary Examiner*—J. F. Duverne
(74) *Attorney, Agent, or Firm*—Henry I. Schanzer, Esq

(57) ABSTRACT

A hermetically sealed package embodying the invention includes a base member having top and bottom surfaces. An electronic device having multiple electrodes is securely mounted on the top surface of the base member. The electrodes of the electronic device are made accessible to external circuits via wire connection to conducting leads disposed through pre-formed holes extending vertically from the top surface to the bottom surface of the base member. The conductive leads then extend horizontally along preformed grooves formed along the bottom surface of the base member. The holes with the leads passing though them are hermetically sealed. A portion of selected conductive leads extending above the top surface are selectively bonded to selected electrodes of the electronic device. A ceramic cap is mounted over and around the electronic device and the conductive leads and encompasses them. The cap has a bottom rim which fits into a preformed trench running along the outer periphery of the base member. The rim and trench are pre-metallized to enable the formation of a hermetic seal.

12 Claims, 5 Drawing Sheets

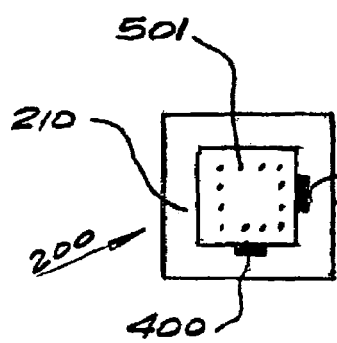
FIG-4D
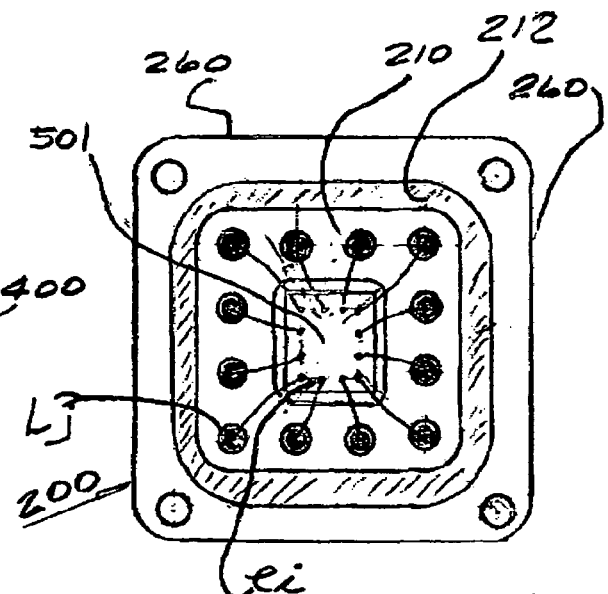
FIG-4A
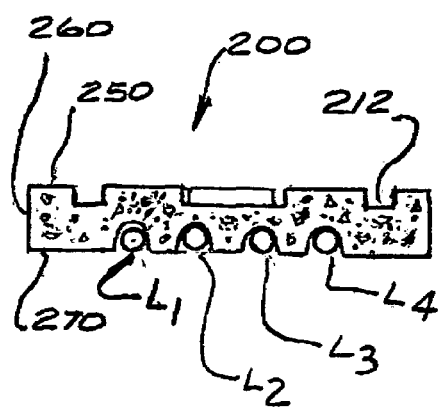
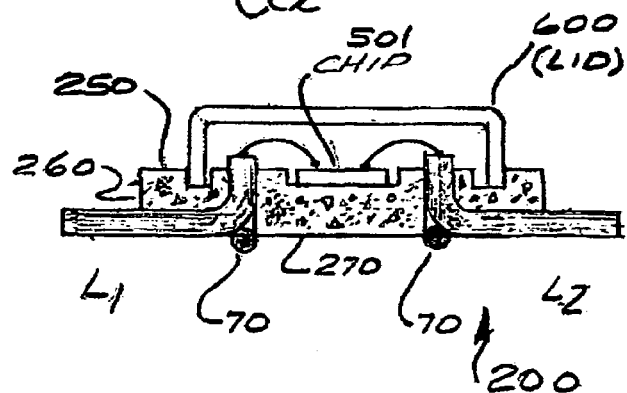
FIG-4B
FIG-4C

HERMETICALLY SEALED CERAMIC PACKAGE

BACKGROUND OF THE INVENTION

This invention relates to a method and apparatus for manufacturing hermetically sealed packages including hermetically sealed ceramic packages.

It is known to use hermetic packages to enclose electronic devices such as semiconductor devices. Hermetic packages are needed to prevent air and moisture from reaching and affecting the electronic device. Hermetic packages are preferably made from suitable materials with good heat conduction and which can be safely and ruggedly hermetically sealed.

A known package (see FIG. 1) includes cantilevered leads and a case with raised walls which interferes with the easy placement of the electronic device within the package and its manipulation. Other known packages are equipped with leads which extend through the bottom of the package to the outside world.

An object of the invention is to provide a hermetic package which prevents air and moisture from affecting its enclosed electronic device, provides good heat conduction, is very rugged, enables the electronic device to be easily mounted and is equipped with an interconnecting sets of leads of the type which enables the package to be easily mounted on different surfaces and to be interconnected to any number of different external systems.

SUMMARY OF THE INVENTION

A hermetically sealed package embodying the invention includes a base member having top and bottom surfaces which are generally parallel to each other. An electronic device having multiple electrodes is securely mounted on the top surface of the base member. The electrodes of the electronic device are made accessible to external circuits via wire connection to conducting leads disposed through preformed holes extending vertically from the top surface to the bottom surface of the base member. The conductive leads then extend horizontally along preformed grooves formed along the bottom surface of the base member. The holes with the leads passing though them are hermetically sealed. A portion of selected conductive leads extending above the top surface are selectively bonded to selected electrodes of the electronic device. A ceramic cap is mounted over and around the electronic device and the conductive leads and encompasses them. The cap has a bottom rim which fits into a preformed trench running along the outer periphery of the base member. The rim and trench are pre-metallized to enable the formation of a hermetic seal.

In packages embodying the invention, the holes are generally vertical and their corresponding grooves (furrows) are generally horizontal, sharing the same center line as the holes, The holes and furrows, as formed, can accept the conductive leads bent at right angles for forming an "L" shaped configuration. The conductive "L" shaped leads extend out the back of the package a suitable distance to allow for testing of the electronic device and to make attachment to selected external systems. The furrows in the bottom surface of the base member are of the right depth to allow the conductive leads to be coplanar with the bottom surface of the base member. This coplanarity allows the package to be surface mounted in electronic products. The vertical top ends of the "L" shaped conductive leads are generally made to extend above the top surface of the base member to provide a surface area for the attachment of connecting wires from selected leads to selected electrodes of the electronic device.

A region may be cut out within the top surface of the base member which defines the space in which the electronic device is mounted and the vertical portion of the conductive leads are located. The surface of the cut out region may be metallized and nickel plated for securely attaching the electronic device using a suitable solder alloy. The metallization coating may be selectively placed to ensure that selected conductive leads are electrically isolated from the electronic device while others are electrically common. Metallization may extend down through and along the inner surfaces of the holes and into and along the furrows to provide the means to braze the leads to the base member for hermetically sealing the leads and base member assembly.

In one embodiment the electronic device mounted on the top surface of the base member is a power transistor having three input/output electrodes. The base member which may be constructed from a beryllium oxide ceramic material has three holes extending from the top to the bottom surface and three grooves, one per hole, extending from the end of the hole along the bottom surface of the base member to the periphery of the base member. Conductive input/output leads, one lead per hole, extend a predetermined distance above the top surface of the base member and pass through the holes and then along the grooves in the bottom surface of the base member. The holes with the conductive leads are hermetically sealed. The electrodes of the power transistor are selectively bonded to selected ones of the conductive leads extending above the top surface.

For the case of a three electrode power transistor semiconductor chip securely mounted on the top surface of the base member, two electrodes from the electronic device may be connected to the top of two conductive leads, electrically isolated from each other and the package, by the attachment of wires to their surfaces using ultrasonic induced energy. The third electrode may be electrically common to the package and to a third conductive lead. Alternatively, the third electrode may also be isolated from the package.

In the manufacture of a package embodying the invention, an electronic device is securely mounted to a pretreated, metalized and plated base member having a predetermined number of holes and grooves. Conductive leads, which may be preformed and which may also be metallized and plated, are then placed in the holes and along the grooves. The base member may then be processed to hermetically seal the conductive leads and the holes within the base member. Selected electrodes of the electronic device may be wire bonded to selected conductive leads. The package may then be hermetically sealed by placing a cap/lid of ceramic material (e.g., Beryllium Oxide or the like) over and around the electronic device and the associated conductive leads, Typically, the cut out region in the top surface of the base member is designed to accept the correspondingly cup shaped cap.

The bottom rim of the cupped shaped cap may be metallized and nickel plated. The cap enclosure surrounds the conductive leads, connector wires and electronic device and fits into a trench formed around the outer periphery of the top surface. Prior to the cap being assembled to the base member a circular flat preform ring, conforming to the shape of the cut out in the top surface of the base member and made from a suitable alloy may be placed at the bottom of the trench. The preform surrounds the conductive leads, connector wires and electronic devices as does the cap. This assembled structure is then placed in a vacuum oven for final hermetic sealing of the device.

BRIEF DESCRIPTION OF THE DRAWINGS

In the accompanying drawings like reference characters denote like components.

FIGS. 4A, 4B, 4C and 4D illustrate the formation of packages with multiple leads suitable for use with integrated and hybrid circuits, in accordance with the invention.

DETAILED DESCRIPTION OF THE INVENTION

Applicants' invention may be better explained and understood with reference to the FIGS. 2A–2F and 3A–3C and 4A–4D.

Figure 1:
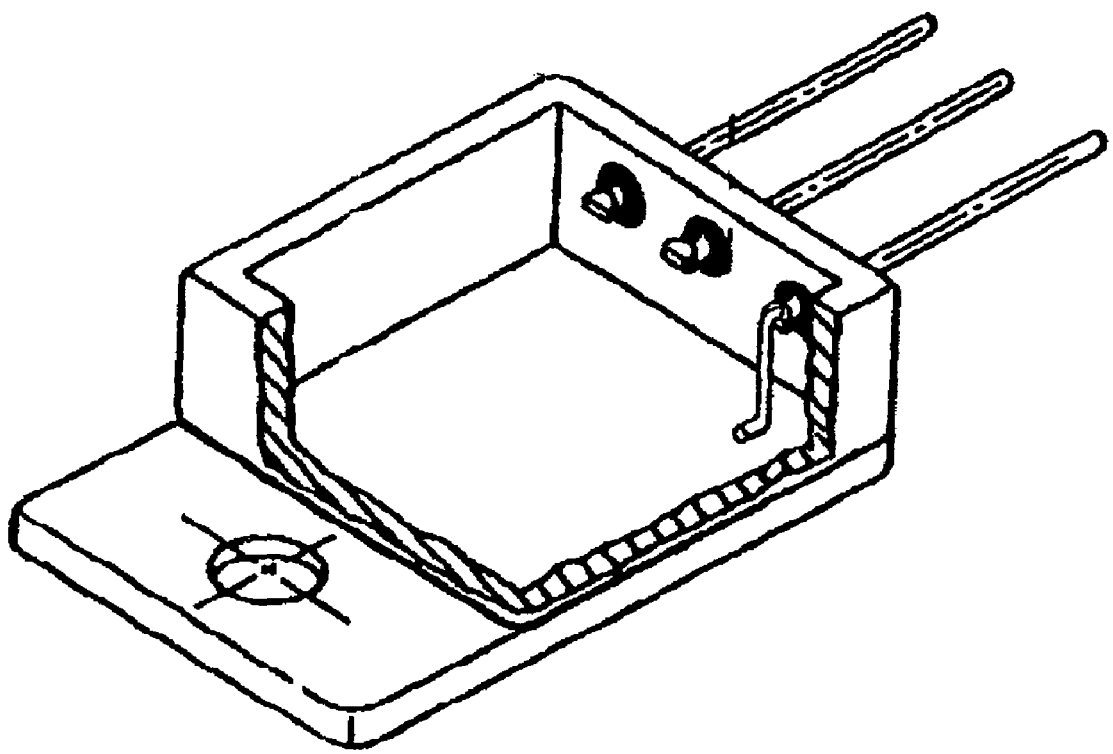
FIG. 1 is an isometric diagram of a prior art package generally referred to as a TO-254 or TO-257.
Figure 2A:
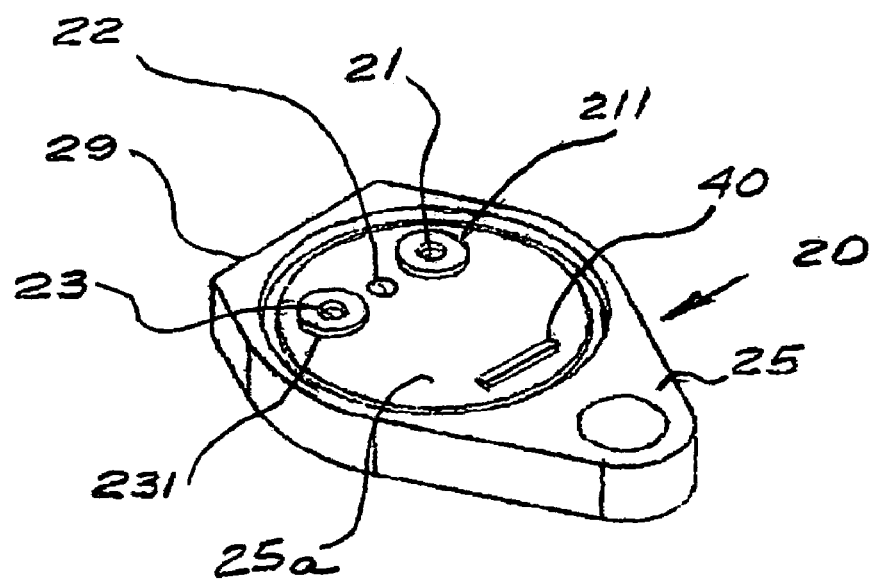
FIG. 2A is an isometric diagram of the top side of the base member of a package embodying the invention.

Referring to FIG. 2A and the other figures, there is shown a base member 20 which may be formed from Beryllium Oxide. Beryllium Oxide may be chosen because it possesses, or provides, the following properties: (a) high thermal conductivity; (b) good electrical insulation; (c) is mechanically strong; (d) is chemically inert; (e) has high temperature capability; (e) has low dielectric loss; (f) exhibits abrasion resistance; (g) is of light weight; (h) exhibits radiation hardness; and (i) is transparent to microwave radiation. However, it should be understood that any other ceramic material may be used to practice the invention.

Figure 2B:
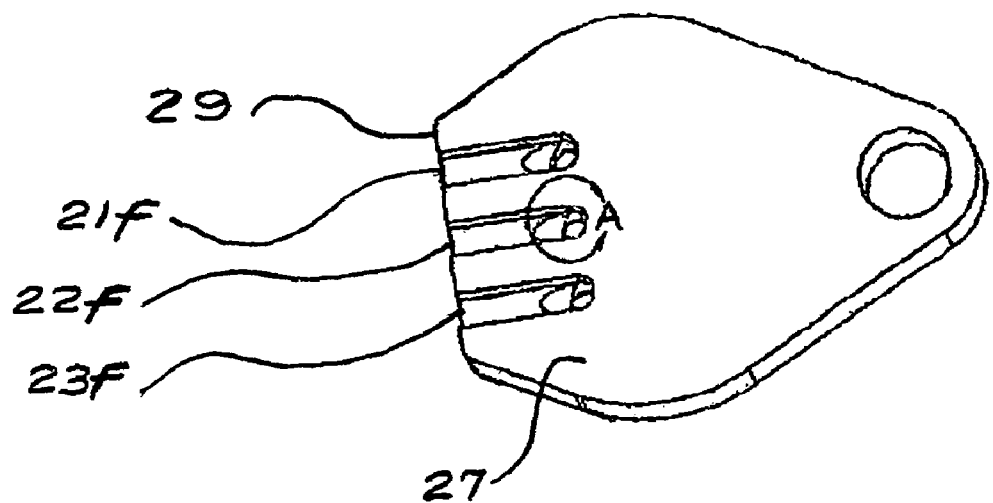
FIG. 2B is an isometric diagram of the bottom side of the base member of a package embodying the invention.
Figure 2E:
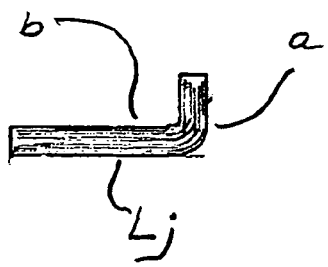
FIG. 2E is a cross sectional diagram of a lead shaped for use in practicing the invention.
Figure 2F:
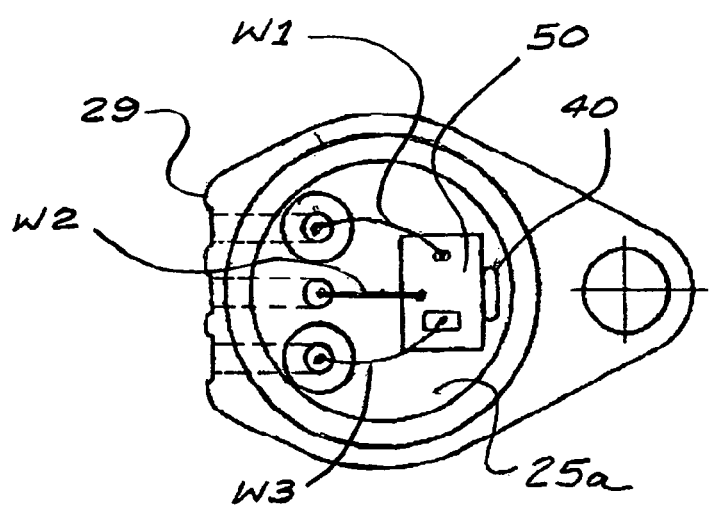
FIG. 2F is a top view of a semiconductor chip mounted on a package embodying the invention.
Figure 2C:
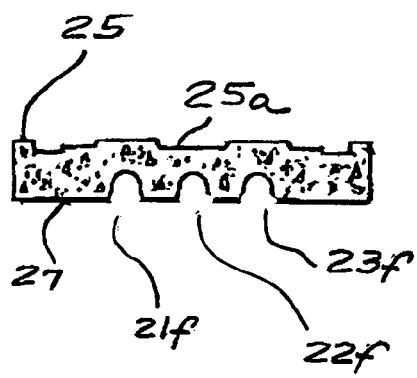
FIG. 2C is a cross sectional diagram of portion of the base member showing furrows (grooves) formed in the base member in accordance with the invention.
Figure 2D:
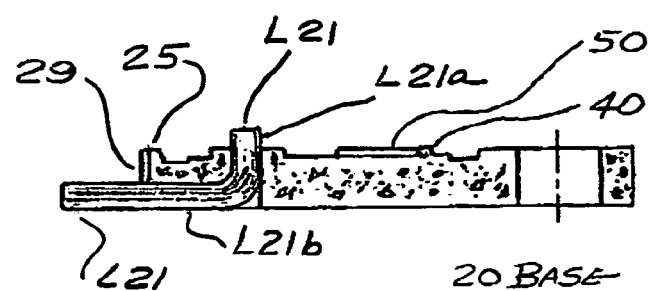
FIG. 2D is a cross sectional diagram of portion of the base member showing the placement of a conductive lead along a furrow and up a hole in accordance with invention.

The base member 20 is formed by compressing a ceramic powder (e.g., beryllium oxide) in a press for forming and shaping the base member 20 to have the desired configuration and features shown in the figures. For purpose of illustration and explanation, the base member 20 is shown to include three (3) holes, 21, 22, and 23, each of which extends vertically from the top surface 25 of the base member to the bottom surface 27 of the base member. Each of these holes is met at the bottom of the base member by an associated horizontal furrow 21f, 22f and 23f. The horizontal furrows (or grooves) are formed in the bottom portion 27 of the base member 20 and extend from the back end 29 of the base member until they meet their corresponding holes, as shown in FIGS. 2B, 2C and 2F. The furrows/grooves are generally perpendicular to their corresponding holes. But, it should be evident that other angular relationships could be used. The thickness and size of the base member may vary over a wide range depending on the characteristics of the electronic device and a desired degree of thermal conductivity and ruggedness.

In the figures, the holes 21, 22, 23 and their corresponding furrows (21f, 22f, 23f) define a space which is of general "L" shape. Conductive wires (leads) which are "L" shaped, as shown in FIG. 2E, are intended to be placed within the holes and furrows as further described below. Thus, the holes 21, 22, 23 and their corresponding furrows can accept conductive leads (L21, L22, L23) shaped to conform to the "L" shaped configuration of the holes and furrows. The conductive wires may be selected to be of nickel because nickel is compatible with ultrasonic aluminum wire bonding practices. However, other less expensive materials may be used and electro plated with nickel to accomplish similar results. The conductive leads/wires are plated with a suitable quantity of silver prior to being assembled into the "L" shaped hole/furrow configuration in the base member. The purpose of silver plating the wires is to provide the medium for brazing the leads (L21, L22, L23) within the holes (21, 22, 23) in the base member 20.

The inner surfaces of the holes (21, 22, 23) and their corresponding furrows as well as the circular crater formed in the top portion of the base member are selectively coated with a suitable metal coating, such as Moly Manganese and/or any like metal, and nickel plated to produce solderable or brazing surfaces. With the internal surfaces of the holes and their corresponding furrows so prepared, the conductive wires/leads L21, L22, L23, are then assembled, with each lead being placed within its corresponding hole and within and along its corresponding furrow. With the conductive leads formed as shown in FIGS. 2E, 2D, 3B and 3C, note that each conductive lead has a vertical or upright section "a" which extends above the top surface 25 of the base member 20 and a section "b" which extends horizontally within and along the furrow. The "vertical" portion, or section "a", of each lead which extends above the top surface of the base member, functions as a post or terminal to which wires from the electrodes of an electronic device 50, may be bonded, after the device 50 is secured to the top surface of base member 20. Electronic device 50 may be any integrated circuit or hybrid circuit or chip.

Once the leads have been assembled to the base member, the assembly is put into an H2 furnace and exposed to a temperature high enough to melt the silver plated on the conductive leads causing adherence to the inside surfaces of the holes 21, 22, 23, which were previously also plated. The assembly is then cooled to solidify the silver within each hole which fastens the leads in position, creating a hermetic seal. The method of sealing the leads is a very significant aspect of the invention. As stated above, the nickel leads are plated with silver and assembled to the metalized nickel plated holes and furrows in the base. The assembly is then heated in a H2 environment to above the melting temperature of silver. The melted silver fuses to the walls of the holes and furrows upon cooling and creates a brazed hermetic structure.

Extending around hole 21 and also above the hole on top surface 25 is a ring like region defined as boss 211, as shown in FIG. 2A. Likewise, extending around hole 23 and also above the hole on top surface 25 is a ring like region defined as boss 231. The top of the two bosses 211 and 231 are void (or voided, if necessary) of metallization and/or nickel plating and are electrically insulated from any conductive path or material present on the top surface of base member 20 which may have been created by prior metallization and nickel plating steps. Therefore, the conductive leads L21 and L23 brazed in holes 21 and 23 and their corresponding furrows (21f, 23f) are electrically insulated and isolated from any metallization and nickel plating present on surface 25 of base member 20.

In the embodiment shown in FIGS. 2A–2F, the hole 22 between holes 21 and 23 may be electrically connected (and electrically common) to the metallization and nickel plating present on the surface of the crater region 25a formed in the top surface of base member 20 for the reasons discussed below. It is intended for an active electronic device/chip 50 to be secured to the top surface 25a of base member 20. The device 50 may be any one of a number of known devices. For purpose of illustration, device 50 may be a metal oxide semiconductor (MOS) such as an insulated gate bipolar transistor (IGBT) or a MOSFET or any type of bipolar transistor having three input/output (I/O) electrodes (e.g., gate, source and drain or base, collector and emitter). One electrode, (e.g., the gate), is intended to be connected (wire bonded) to lead L21, another electrode (e.g., the source) is intended to be connected (wire bonded) to lead L23 and a third electrode (e.g., the drain) is intended to be connected, or common, to lead L22. Lead L22 thus acts as a connection to the third electrode related to the electronic device 50 to be mounted and affixed in the metallized area 25a of the cavity. Note that the connection between the third (e.g., drain) electrode and lead 22 may be by means of a wire bond or by conduction along a conduction path formed on the surface 25a of the base member between the drain electrode on chip and lead L22.

Thus, the base member 20 may be constructed to have three brazed in, hermetically sealed, leads and a metalized nickel plated top surface 25a which is ready to accept an electronic device 50. The active device 50 may be positioned in a metalized nickel plated crater region 25a, formed within the top surface 25, in a suitable location for solder attachment. The top surface 25a of base member 20 embodying the invention may include a raised step or ridge 40 as shown at the right end of the base member in FIGS. 2A, 2F and 3A. The step 40 may be formed at the time the base member is formed. Step 40 is formed to enable the chip 50 to be placed so as to abut the step 40 whereby the chip 50 is located at the desired distance from the leads and at a precise location on the surface of the base member. This enables an operator to locate the placement of the electronic device 50 on the base member more precisely. This is the case whether the operation is done manually or automatically. Thus, the step 40 provides an improved means for locating the electronic device in the package.

The electronic device 50 may then be secured to the top surface of the base member by any known method or technique. In one embodiment, after the electronic device 50, which is assumed to be an insulated gate field effect power device having 3 active electrodes, is solder attached to the cavity in the base member it is prepared to have two of the three active electrodes on the device connected to the two isolated nickel leads. By way of example, assuming the power device to have a gate electrode, a source electrode and a drain electrode, the gate electrode may be connected to lead L21 and the source electrode may be connected to L23, while the drain electrode may be connected to L22. This is accomplished by attaching an aluminum wire (shown as w1 and w3 in FIG. 2F, and which may also include w2, if so opted) between each active electrode of the electronic device 50 and the top surfaces of the leads L21 and L23 (and L22 if so opted) with ultrasonic energy, as illustrated, for example, in FIGS. 2F and 3C.

Figures 3A, 3B, 3C:
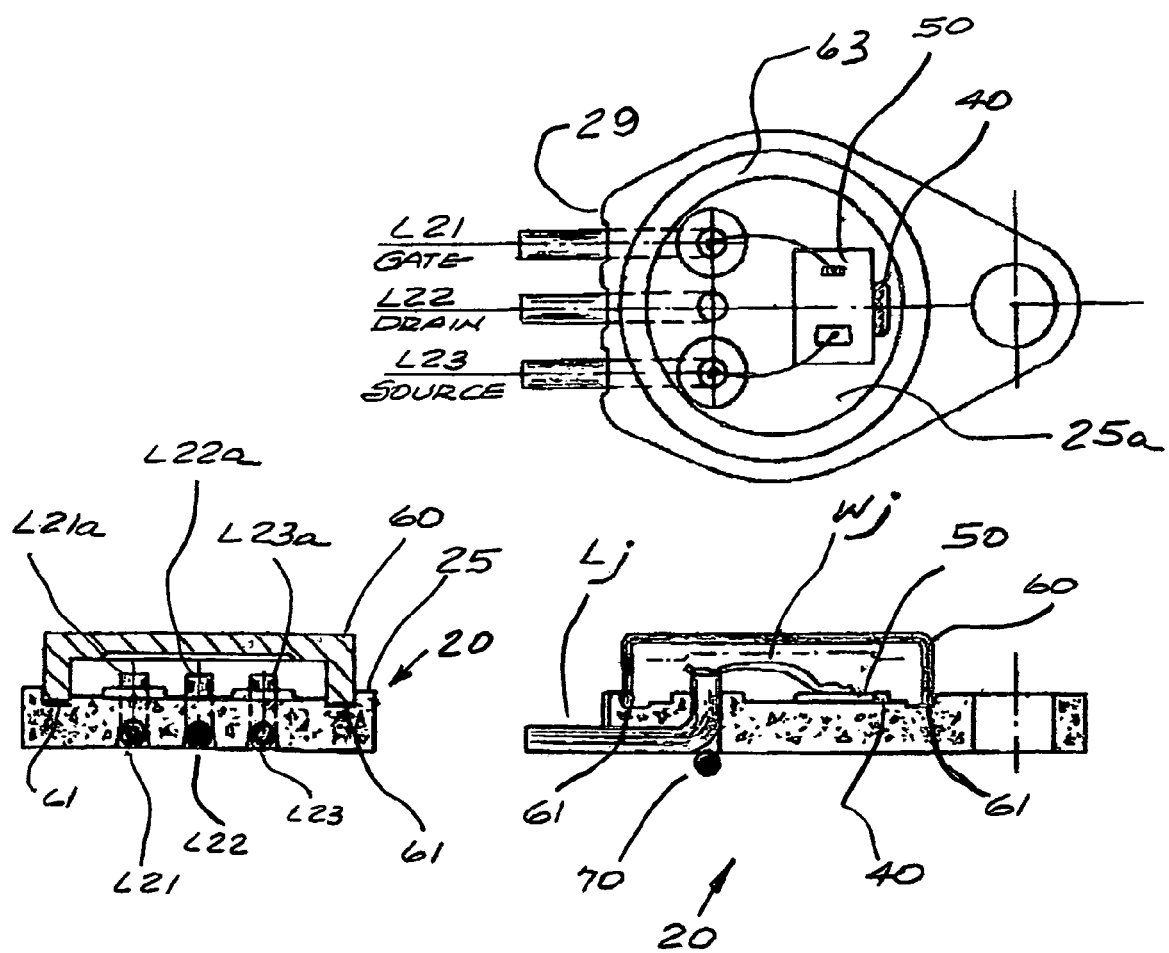
FIG. 3A is another top view of a chip mounted on a package embodying the invention.
FIGS. 3B and 3C are cross sectional diagrams illustrating the final configuration of a package formed in accordance with the invention.

After the electrodes of the electronic device 50 are attached to the leads, the package is ready to be enclosed in an air free environment. This is accomplished by placing a cap 60, as shown in FIGS. 3B and 3C, that fits into the cavity formed in the top surface of the base member over the active elements. The cap 60 is cup shaped to clear the wires and its bottom rim 61 is metalized and nickel plated. In FIG. 3A there is shown a circular trench 63 surrounding the space 25a designated for the placement of the electronic device and the vertical conductive leads. A circular washer shaped preform made of a suitable material fits into the trench 63, which defines the outer periphery of the crater 25a, prior to assembling the cap 60. The preform material may be any suitable material having a melting temperature lower than the melting point of the solder used to attach the electronic device to the base member 20. This totally enclosed packaged device is then put into a vacuum oven for final sealing. Vacuum is used to create an air (and oxygen) free environment and then heated to melt the preform under the cap rim to form the hermetic seal. Sealing occurs after a vacuum is applied to create an air free environment and sufficient heat is applied to melt the perform underneath the cap's rim to form the hermetic seal.

Note that FIG. 3A shows the leads L21, L22, L23, extend beyond the end 29 of the case running parallel to the ground plane for facilitating the mounting and connection of the leads to any external device. The leads extending from the package are coplanar with the base allowing surface mounting capability as well as conventional methods of assembly of the package in any electronic system.

FIG. 3B illustrates that the leads L21, L22, L23, fit within their corresponding furrows and that the "a" portion of each lead extends above the top surface 25.

FIG. 3C illustrates that each lead (Lj) extends above the top surface of the base member and that a wire bond (wj) extends from a selected electrode of the electronic device 50 to the top of the lead Lj, as described above. To ensure that the leads are tightly secured to the base member and that the hermetic seal is reinforced, an additional braze alloy ball 70 may be formed at the bottom of each hole, along the bottom surface where the conductive lead bends into the furrow.

The invention has been illustrated using a three electrode/terminal semiconductor device. It should be appreciated that the invention is applicable for use with any electronic or optical or electro-optical device having more leads. It should also be appreciated that the package could include more than one device with the devices being of different type.

It should be appreciated that a feature of the invention includes the making of a hermetic power semiconductor package fabricated entirely from Beryllium Oxide with the exception of the nickel leads which conduct power and signals between the electronic device 50 internal to the package and terminals outside of the package. As already noted a package made of Beryllium Oxide has very low weight. For example, a package embodying the invention weighed 1.6 grams versus 5.87 gram for a standard TO-254 package. Such packages exhibit a high degree of electrical insulation rendering the components within the package resistant to electrical arcing from sources within and without the package. Such packages are also chemically resistant to numerous chemicals and have a high temperature capability since the melting point of the beryllium oxide is 2650° C. The package is extremely rugged since it can withstand the impact of a 30 caliber bullet. It is transparent to microwave radiation and is radiation hardened. However, as also noted above, the invention is not limited to beryllium oxide, and any ceramic material may be used to practice the invention.

The leads, as formed and mounted within the base member, are very sturdy and can readily handle the ultrasonic wire bonding forces and energy when connections are made to the electronic device 50.

The package, as formed, allows the chip 50 to be directly placed on the top surface 25a of the base member. This offers lower thermal resistance than is found in conventional packages using a metal base which requires that the chip be insulted electrically from the metal base.

A significant feature of packages embodying the invention is that the top surface of the base member is open when the chip 50 is placed on the top surface. There are no walls impeding the attachment of the die 50 within any desired area.

As described, the package is vacuum braze sealed as opposed to welding. This virtually eliminates the concern for Particle Incidence Noise Detection (PIND) which results when welding which may cause particles to be injected within the package.

Referring to FIG. 4A, there is shown a ceramic base member 200 of same or similar material as member 20, described above. The base member 200 includes a central region 210 for the placement therein of an electronic device 501. The central region may be a crater like area cut back from top surface 250. Electronic device 501 may be securely attached (e.g., soldered or bonded) to the top surface 210 of base member 200 in any suitable manner. Electronic device 501 may be any semiconductor device and/or any electro optical device and/or hybrid device which needs to be encased within an hermetically sealed package. Electronic device 501 may have numerous electrodes (ei) and may be part of an electronic system which requires that the electrodes of device 501 be electrically connected to circuitry external to device 501.

Surrounding device 501 is a region in which thru-holes extending between the top 250 and bottom 270 surfaces of base member 200 are formed (or preformed). As shown in FIG. 4A, there are at least as many thru-holes as there are electrodes which need to be connected to a conductive lead. As above, and as indicated in FIG. 4B, each hole terminates in a groove formed in the bottom surface of the base member. The holes and their corresponding grooves are generally perpendicular to each other. This perpendicular relationship is generally preferred, but holes and grooves having other geometrical relationships may be used without departing from the inventive concept. As before, conductive leads, Lj, (which may be preformed) are inserted in the holes and grooves, as shown in FIG. 4C. The leads extend vertically a predetermined distance above the top surface 250 of the base member and are designed to extend horizontally a predetermined distance beyond the outer perimeter 260 of the base member to facilitate interconnection with other circuit components.

The holes and grooves and the leads inserted therein are all coated with appropriate metals and materials and the holes are then hermetically sealed by applying appropriate heating and cooling cycles to the assembly. As before additional sealing balls 70 may be added to ensure a rugged seal.

The region 210 is surrounded by a trench 212 adapted to receive the lower rim of a lid/cap 600. The lid 600 may be of any desired shape. In FIG. 4A, by way of example, it is shown to be generally square like; but it could have any appropriate shape. The trench and the rim of the package are coated with appropriate materials to ensure that the assembly is hermetically sealed, as described above.

Thus, as for the embodiments shown in FIGS. 2A–2E and 3A–3C, the embodiment shown in FIGS. 4A–4D includes conducting leads Lj which make contact to the electrodes (ei) of an electronic device (e.g., device 501). The passageways (e.g., holes) of the conducting leads Lj contacting the electrodes (ei) of device 501 and exiting from the base member 200 are hermetically sealed. Likewise, a cap is fitted over the electronic device and the region in which the electrodes of the device make contact with the conductive leads.

Also as above, steps or ridges 400, may be formed within region 210 of the base member, as shown in FIG. 4D, to define the location for the electronic device attached to the top surface of the base member.

The top and bottom surfaces of the base member are shown to be generally parallel, but a package embodying the invention need not have a base member with parallel top and bottom surfaces. Other configurations may be used to practice the invention.

What is claimed is:

1. A hermetically sealed package comprising:
    a base member of electrically non-conductive material having an outer periphery and having a top surface and a bottom surface;
    means for securely mounting an electronic device having a plurality of electrodes on the top surface of the base member;
    means for accessing the electrodes of the electronic device comprising:
        a—a plurality of holes extending from the top surface to the bottom surface of the base member;
        b—corresponding to each one of said plurality of holes there is formed a furrow along the bottom surface of the base member, each furrow extending between the intersection of its corresponding hole with the bottom surface of the base member and the outer periphery of the base member;
        c—a plurality of leads of conductive material, one lead per hole and its corresponding furrow, each one of said plurality of leads being shaped to fit within and along a furrow and its corresponding hole; each lead extending through its hole a given distance above the top surface of the base member; where where each one of said plurality of electrodes, holes and leads includes a number greater than two;
    means brazing each lead within its hole for forming a hermetic seal between the lead and the inner surfaces of the hole;
    selected ones of the leads being electrically insulated from the other leads and selected ones of the leads being wire bonded to selected electrodes of the electronic device; and
    a lid mounted over the top surface of the base member covering the electronic device and the leads extending above the top surface of the base member, said lid having a bottom rim brazed to the top surface of the base member for providing an hermetically sealed package.

2. A hermetically sealed package as claimed in claim 1, wherein the base member and lid are made of ceramic material.

3. A hermetically sealed package as claimed in claim 2, wherein the ceramic material is beryllium oxide.

4. A hermetically sealed package as claimed in claim 1, wherein the base member includes a preformed ridge for defining the location of the electronic device and against which the electronic device may be securely positioned.

5. A hermetically sealed package as claimed in claim 1, wherein the base member includes a trench formed along the outer periphery of the base member and wherein the bottom rim of the lid fits into the trench and wherein the trench and lid are pre-metallized for enabling the formation of a secure hermetic seal.

6. A hermetically sealed package as claimed in claim 2, wherein the conductive leads and the inner surfaces of the holes are pre-metallized for enabling the formation of a secure hermetic seal.

7. A hermetically sealed package as claimed in claim 1, wherein said plurality of conductive leads run along the grooves in the bottom surface of the base member and extends beyond the outer perimeter of the base member.

8. A hermetically sealed package as claimed in claim 1, wherein the top and bottom surfaces are generally parallel to each other and the location of the holes is outside the site of the electronic device.

9. A method of forming a hermetically sealed package for accessing selected electrodes of an electronic package having a multiplicity of electrodes comprising the steps of:
   forming a base member having top and bottom surfaces;
   defining a space on the top surface of the base member for locating the electronic device;
   corresponding to each electrode of the electronic device to be accessed forming a hole in a selected regions of the base member; each hole extending from the top to the bottom surface of the base member;
   forming a groove corresponding to each one of said holes along the bottom surface of the base member extending from hole ending at the bottom surface and running to the outer periphery of the base member;
   plating the holes and grooves with materials for facilitating the subsequent sealing of the holes;
   securely attaching the electronic device to the top surface of the base member within the defined space;
   inserting a conductive lead along each groove and hole, one end of each lead extending vertically above the top surface of the base member and the other end of each lead extending horizontally beyond the outer periphery of the base member;
   connecting the vertical end of selected leads to selected electrodes of the electronic device;
   hermetically sealing the holes with their respective conductive leads in place within the holes;
   mounting a lid over the top surface of the base member covering the electronic device and the leads extending above the top surface of the base member; and
   hermetically sealing the bottom rim of the lid to the top surface of the base member for providing an hermetically sealed package.

10. A method as claimed in claim 9, wherein defining the space for locating the electronic device includes forming a step on the top surface of the base member.

11. A hermetically sealed package comprising:
   a base member of electrically non-conductive material having an outer periphery and having a top surface and a bottom surface;
   means securely mounting an electronic device having a multiplicity of electrodes onto said top surface; and wherein said electronic device has "n" electrodes which are to be accessed;
   means for accessing the electrodes of the electronic device comprising:
   a—for each one of said electrodes to be accessed a preformed thru-hole in said base member extending from the top surface to the bottom surface of the base member;
   b—corresponding to each one of said thru-holes there is preformed a furrow along the bottom surface of the base member, each furrow extending from the intersection of its corresponding thru hole with the bottom surface of the base member to the outer periphery of the base member;
   c—a lead of conductive material, one lead per thru-hole and its corresponding furrow, each one of said lead being shaped to fit within and along a furrow and its corresponding hole; each lead extending vertically through its hole a given distance above the top surface of the base member and each lead extending horizontally co-planarly with the bottom surface of the base member a given distance beyond the outer periphery of the base member;
   means brazing each lead within its hole for forming a hermetic seal between the lead and the inner surfaces of the hole;
   selected ones of the leads being electrically insulated from the other leads and selected ones of the leads being wire bonded to selected electrodes of the electronic device; and
   a lid mounted over the top surface of the base member covering the electronic device and the leads extending above the top surface of the base member, said lid having a bottom rim brazed to the top surface of the base member for providing an hermetically sealed package.

12. A hermetically sealed package as claimed in claim 11, wherein a brazed alloy ball is formed at the intersection of a hole with the bottom surface of the base member to ensure that the hole is hermetically sealed.

* * * * *

UNITED STATES PATENT AND TRADEMARK OFFICE
CERTIFICATE OF CORRECTION

PATENT NO. : 7,281,946 B2  Page 1 of 1
APPLICATION NO. : 11/354434
DATED : October 16, 2007
INVENTOR(S) : Dino Nicoletta and Robert J. Satriano It is certified that error appears in the above-identified patent and that said Letters Patent is hereby corrected as shown below:

On the Title page item (73) of the title page, delete the named assignee. American Berylin Corp.

Signed and Sealed this

Twenty-second Day of July, 2008

JON W. DUDAS
*Director of the United States Patent and Trademark Office*